(12) United States Patent
Hung

(10) Patent No.: US 11,256,416 B2
(45) Date of Patent: Feb. 22, 2022

(54) BUTTON DEVICE

(71) Applicant: QUIXANT PLC, Cambridge (GB)

(72) Inventor: Chih-Chi Hung, New Taipei (TW)

(73) Assignee: QUIXANT PLC, Cambridge (GB)

( * ) Notice: Subject to any disclaimer, the term of this patent is extended or adjusted under 35 U.S.C. 154(b) by 0 days.

(21) Appl. No.: 16/826,303

(22) Filed: Mar. 23, 2020

(65) Prior Publication Data

US 2021/0294490 A1    Sep. 23, 2021

(51) Int. Cl.
   *G06F 3/0488*     (2013.01)
   *G06F 3/02*       (2006.01)
   *G06F 3/04886*    (2022.01)

(52) U.S. Cl.
   CPC ........ *G06F 3/04886* (2013.01); *G06F 3/0202* (2013.01); *G06F 2203/04105* (2013.01)

(58) Field of Classification Search
   None
   See application file for complete search history.

(56) References Cited

U.S. PATENT DOCUMENTS

| 2008/0006516 | A1 | 1/2008 | Nishino et al. |
| 2010/0238119 | A1 | 9/2010 | Dubrovsky et al. |
| 2011/0227841 | A1 | 9/2011 | Argiro |
| 2011/0267274 | A1 | 11/2011 | Shusteri |
| 2015/0094149 | A1* | 4/2015 | Sumi ................... G07F 17/3209 463/37 |
| 2019/0102969 | A1* | 4/2019 | Lapalme ............. G07F 17/3211 |

FOREIGN PATENT DOCUMENTS

| CN | 206148325 U | 5/2017 |
| CN | 107210158 A | 9/2017 |
| GB | 2516439 A | 1/2015 |
| TW | 201810325 A | 3/2018 |
| WO | WO2016113736 A1 | 7/2016 |

* cited by examiner

*Primary Examiner* — Stephen T. Reed
(74) *Attorney, Agent, or Firm* — Li & Cai Intellectual Property Office

(57) ABSTRACT

A button device and a manipulation structure thereof are provided. The manipulation structure includes a plurality of brackets and a plurality of transparent keys respectively fixed to the brackets. Each bracket has an elastic segment, a fixing segment, and a placing segment, the latter two of which are connected to two opposite ends of the elastic segment. Each transparent key includes a press portion and an abutting portion. The press portion is fixed to the fixing segment of the corresponding bracket, and has a touch surface arranged away from the corresponding bracket. The abutting portion extends from the press portion along a displacement direction away from the touch surface, and a width of the abutting portion is less than that of the press portion. The touch surface of each of the transparent keys can be moved along the displacement direction to deform the corresponding bracket by being pressed.

8 Claims, 12 Drawing Sheets

BUTTON DEVICE

FIELD OF THE DISCLOSURE

The present disclosure relates to a key, and more particularly to a button device and a manipulation structure thereof.

BACKGROUND OF THE DISCLOSURE

An icon of a conventional touch-control panel cannot provide a tactile feedback when touched, so that when a user cannot devote full attention to the conventional touch-control panel (e.g., when the user is driving), the user cannot know whether or not a certain icon is actually touched.

SUMMARY OF THE DISCLOSURE

In response to the above-referenced technical inadequacies, the present disclosure provides a button device and a manipulation structure thereof to effectively improve on the issues associated with conventional touch-control panels.

In one aspect, the present disclosure provides a button device, which includes a manipulation structure and a touch-control screen. The manipulation structure includes a plurality of brackets and a plurality of transparent keys. Each of the brackets has an elastic segment, a fixing segment, and a placing segment. The fixing segment and the placing segment of each of the brackets are connected to two opposite ends of the elastic segment. The transparent keys are respectively fixed to the brackets, and each of the transparent keys includes a press portion and an abutting portion. The press portion is fixed to the fixing segment of the corresponding bracket. The press portion has a touch surface arranged away from the corresponding bracket. The abutting portion extends from the press portion along a displacement direction that extends away from the touch surface. A width of the abutting portion is less than that of the press portion. The touch surface of each of the transparent keys is configured to move along the displacement direction by being pressed, so that the elastic segment of the corresponding bracket is deformed to generate an elastic force. The touch-control screen has a touch-control region. The manipulation structure is arranged corresponding in position to the touch-control region, and the abutting portion of each of the transparent keys faces toward and is spaced apart from the touch-control region. A part of each of the transparent keys facing the touch-control region is configured to show an icon of the touch-control region, and the touch surface of each of the transparent keys is configured to be pressed so as to move the abutting portion to abut against the corresponding icon.

In one aspect, the present disclosure provides a manipulation structure of a button device for being applied to a touch-control screen. The manipulation structure includes a plurality of brackets and a plurality of transparent keys. Each of the brackets has an elastic segment, a fixing segment, and a placing segment. The fixing segment and the placing segment of each of the brackets are connected to two opposite ends of the elastic segment. The transparent keys are respectively fixed to the brackets, and each of the transparent keys includes a press portion and an abutting portion. The press portion is fixed to the fixing segment of the corresponding bracket. The press portion has a touch surface arranged away from the corresponding bracket. The abutting portion extends from the press portion along a displacement direction that extends away from the touch surface. A width of the abutting portion is less than that of the press portion. The touch surface of each of the transparent keys is configured to move along the displacement direction by being pressed, so that the elastic segment of the corresponding bracket is deformed to generate an elastic force.

Therefore, when a user presses the touch surface of the transparent key of the present disclosure, the elastic force generated from the elastic segment of the bracket and the abutment between the abutting portion and the icon can jointly provide a tactile feedback to the user, so that the user can control the button device with limited focus and can distinctly know when the transparent key contacts the icon.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
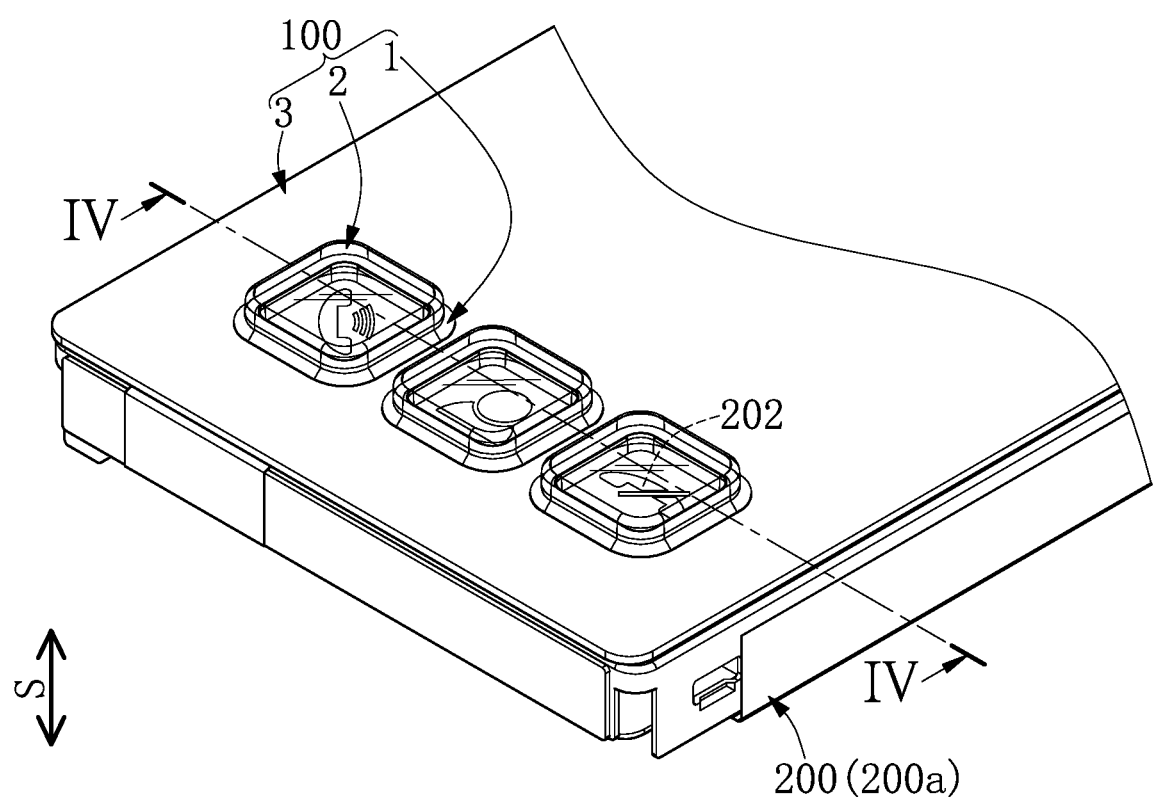
FIG. 1 is a perspective view of a button device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

First Embodiment

Figure 2:
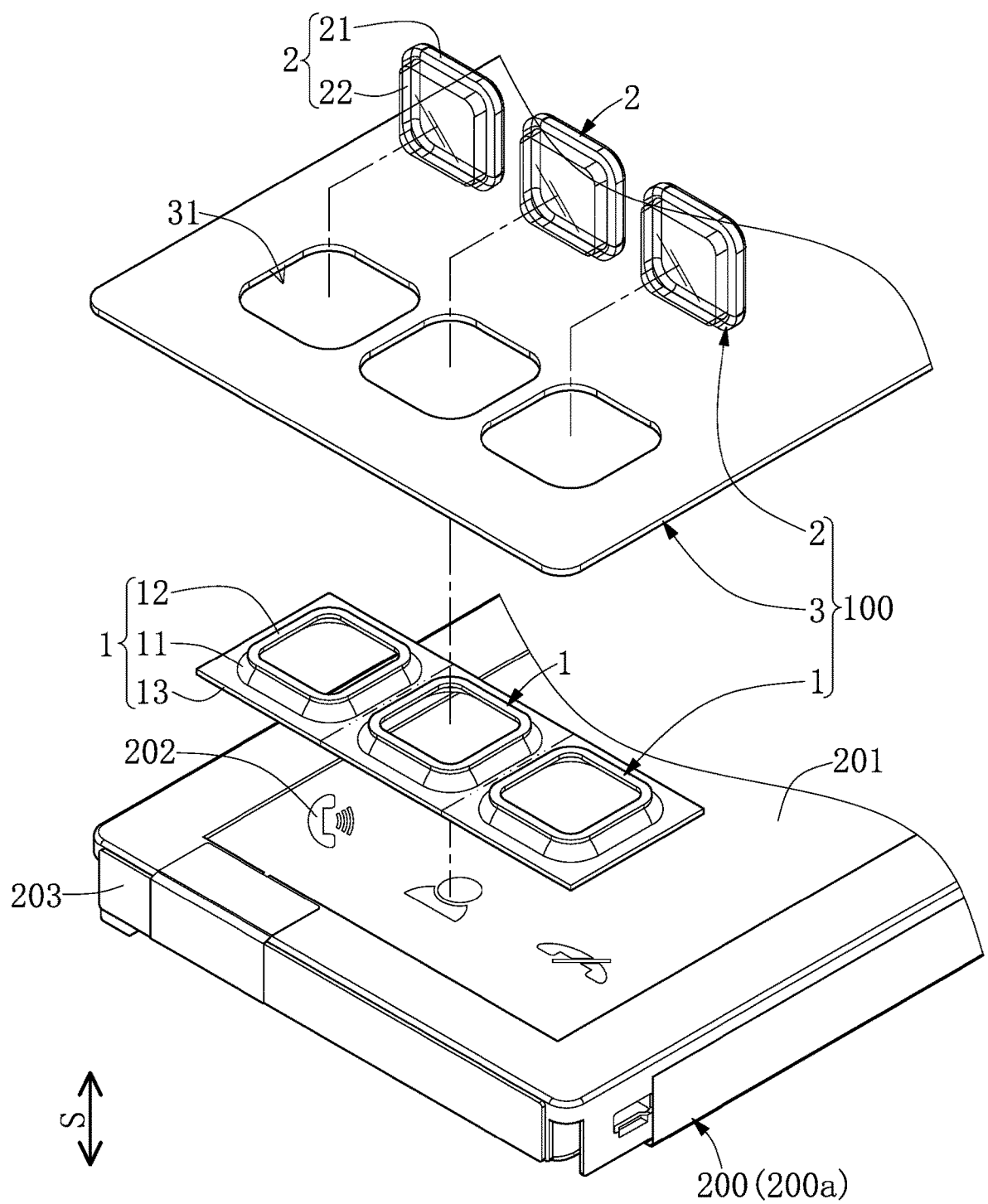
FIG. 2 is an exploded view of FIG. 1.

Referring to FIG. 1 to FIG. 8, a first embodiment of the present disclosure provides a button device. As shown in FIG. 1 and FIG. 2, the button device includes a touch-control screen 200 and a manipulation structure 100 that is disposed on the touch-control screen 200. The touch-control screen 200 has a touch-control region 201, and the touch-control screen 200 in the present embodiment is a capacitive touch-control screen 200a.

It should be noted that the manipulation structure 100 in the present embodiment is used in cooperation with the touch-control screen 200, but the present disclosure is not limited thereto. For example, in other embodiments of the present disclosure, the manipulation structure 100 of the button device can be independently used (e.g., sold) or can be used in cooperation with other devices.

The manipulation structure 100 is arranged corresponding in position to the touch-control region 201 of the touch-control screen 200 (e.g., the manipulation structure 100 is arranged to face the touch-control region 201). The manipulation structure 100 includes a plurality of brackets 1, a plurality of transparent keys 2 respectively fixed to the brackets 1 (i.e., each of the transparent keys 2 is fixed to one of the brackets 1), and a cover 3 that is provided to position the transparent keys 2.

The brackets 1 in the present embodiment are of the same structure, but the present disclosure is not limited thereto. For example, in other embodiments of the present disclosure, the brackets 1 can be of different structure.

Figure 3:
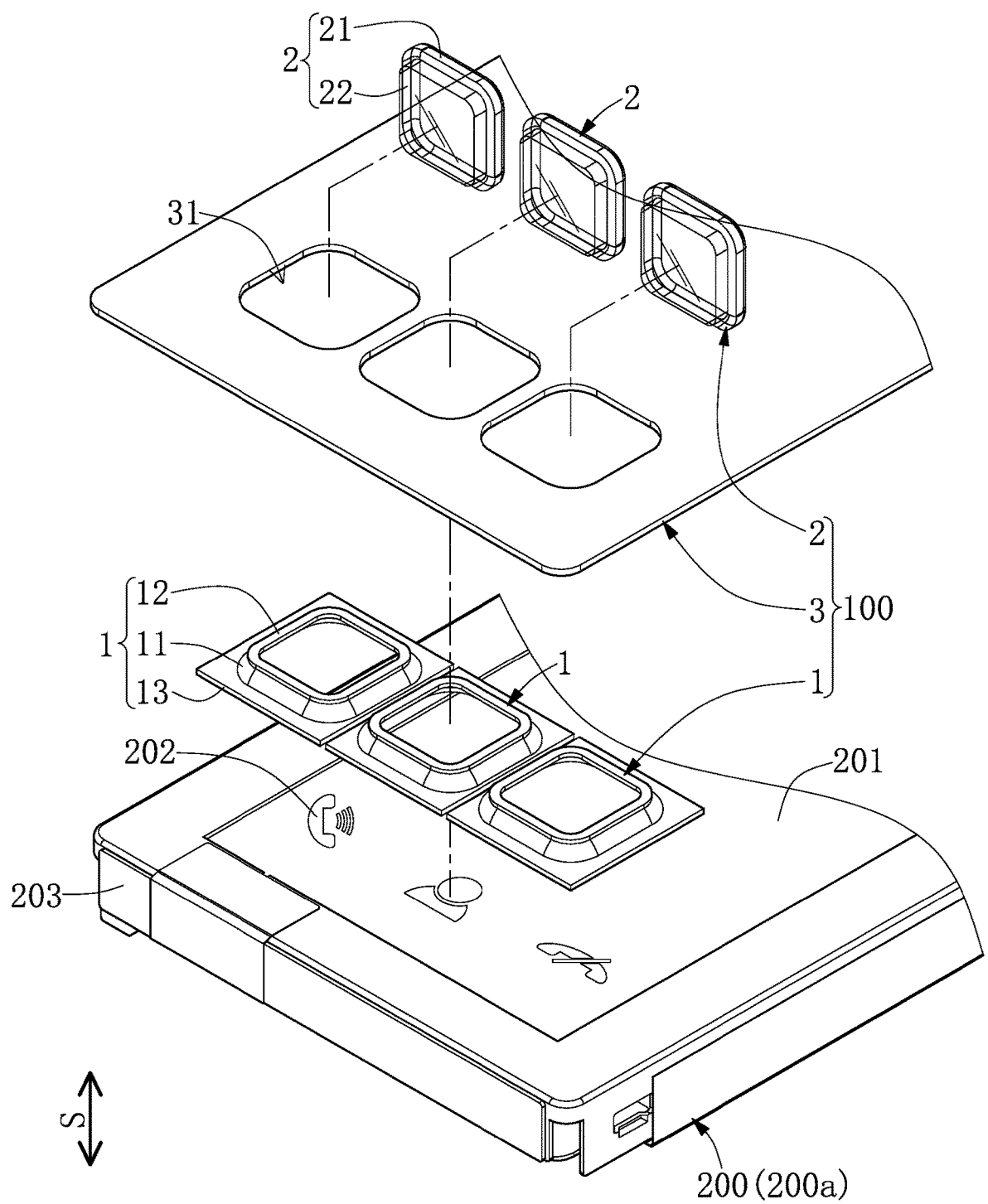
FIG. 3 is an exploded view showing the button device in another configuration according to the first embodiment of the present disclosure.
Figure 4:
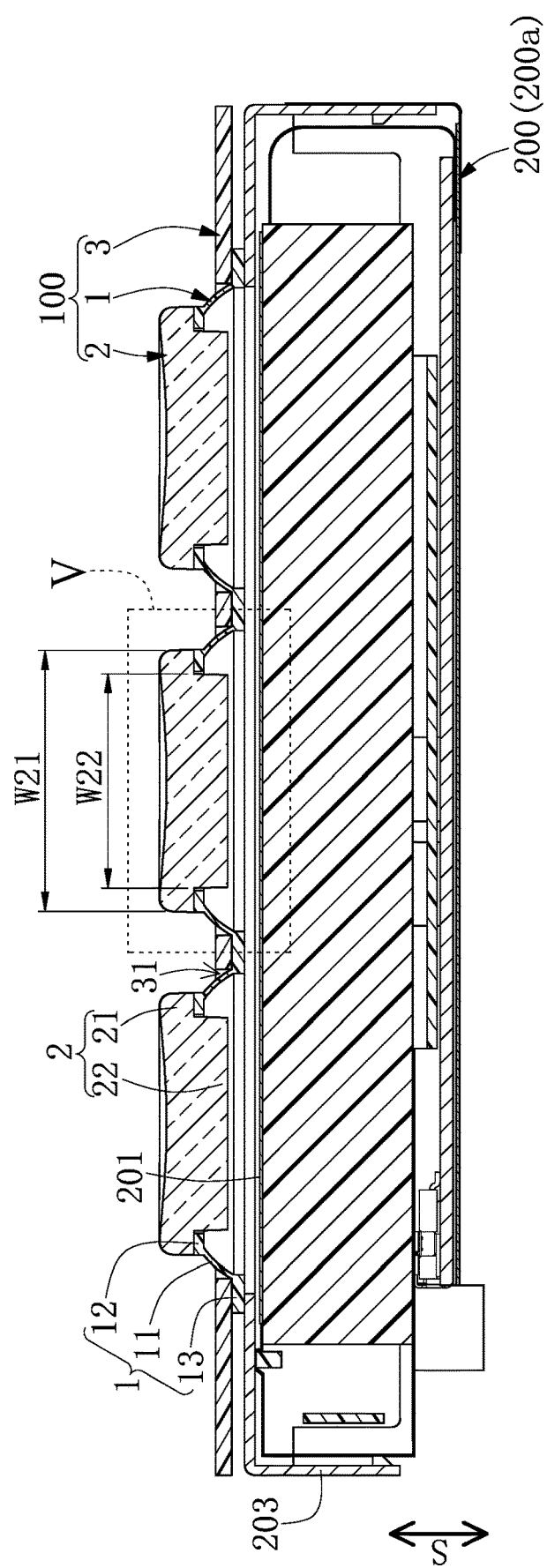
FIG. 4 is a cross-sectional view taken along line IV-IV of FIG. 1.

Each of the brackets 1 in the present embodiment is a rigid supporting structure. Specifically, each of the brackets 1 includes an elastic segment 11, a fixing segment 12, and a placing segment 13, the latter two of which are connected to two opposite ends of the elastic segment 11 (e.g., the top end and the bottom end of the elastic segment 11 shown in FIG. 2). The placing segments 13 of the brackets 1 in the present embodiment are integrally formed as a one-piece structure (e.g., the brackets 1 are formed as a membrane), but the present disclosure is not limited thereto. For example, as shown in FIG. 3, the placing segment 13 of each of the brackets 1 can be an individual piece that is not connected to the placing segment 13 of another one of the brackets 1.

As shown in FIG. 2 and FIG. 4 to FIG. 6, in any one of the brackets 1 of the present embodiment, each of the fixing segment 12 and the placing segment 13 is in a rectangular ring-shape, an inner edge of the fixing segment 12 surroundingly defines a small opening 121, and an inner edge of the placing segment 13 surroundingly defines a big opening 131 (i.e., an area of the big opening 131 is greater than that of the small opening 121). Moreover, the elastic segment 11 is in a rectangular ring-shape, and an end of the elastic segment 11 is connected to an outer edge of the fixing segment 12, and another end of the elastic segment 11 is connected to the inner edge of the placing segment 13.

As the transparent keys 2 in the present embodiment are of the same structure, the following description describes the structure of just one of the transparent keys 2 and the corresponding bracket 1, but the present disclosure is not limited thereto. For example, in other embodiments of the present disclosure, the transparent keys 2 can be of different structure.

Specifically, the transparent key 2 is integrally formed as a one-piece structure, and the transparent key 2 includes a press portion 21 and an abutting portion 22. The press portion 21 is substantially in a cubic shape, and the outer surface of the press portion 21 includes a touch surface 211 arranged away from the abutting portion 22, an annular step surface 212 arranged away from the touch surface 211, and a surrounding lateral surface 213 that connects the touch surface 211 and the annular step surface 212.

Figure 7:
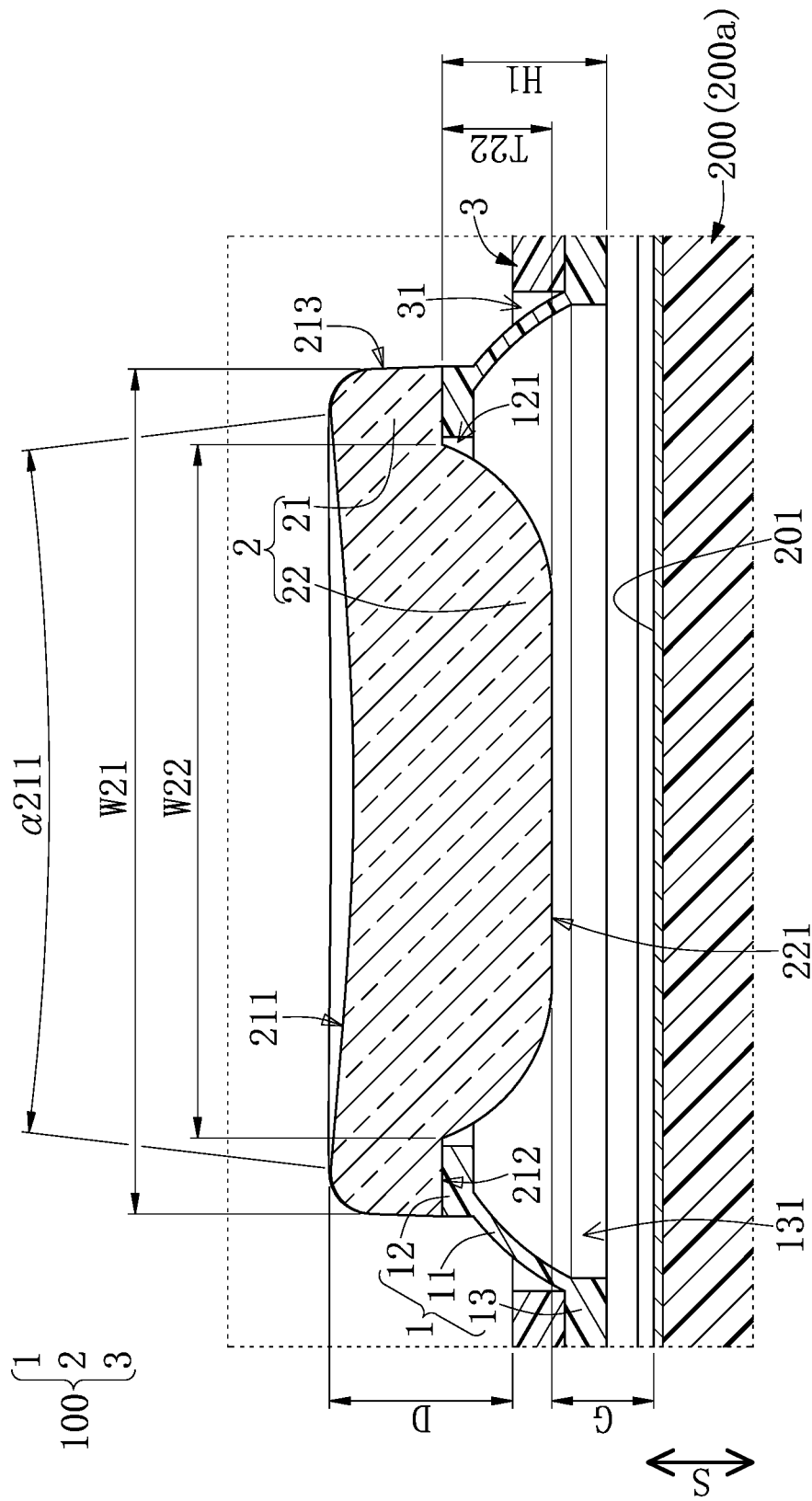
FIG. 7 is a cross-sectional view showing the transparent key in another configuration according to the first embodiment of the present disclosure.
Figure 8:
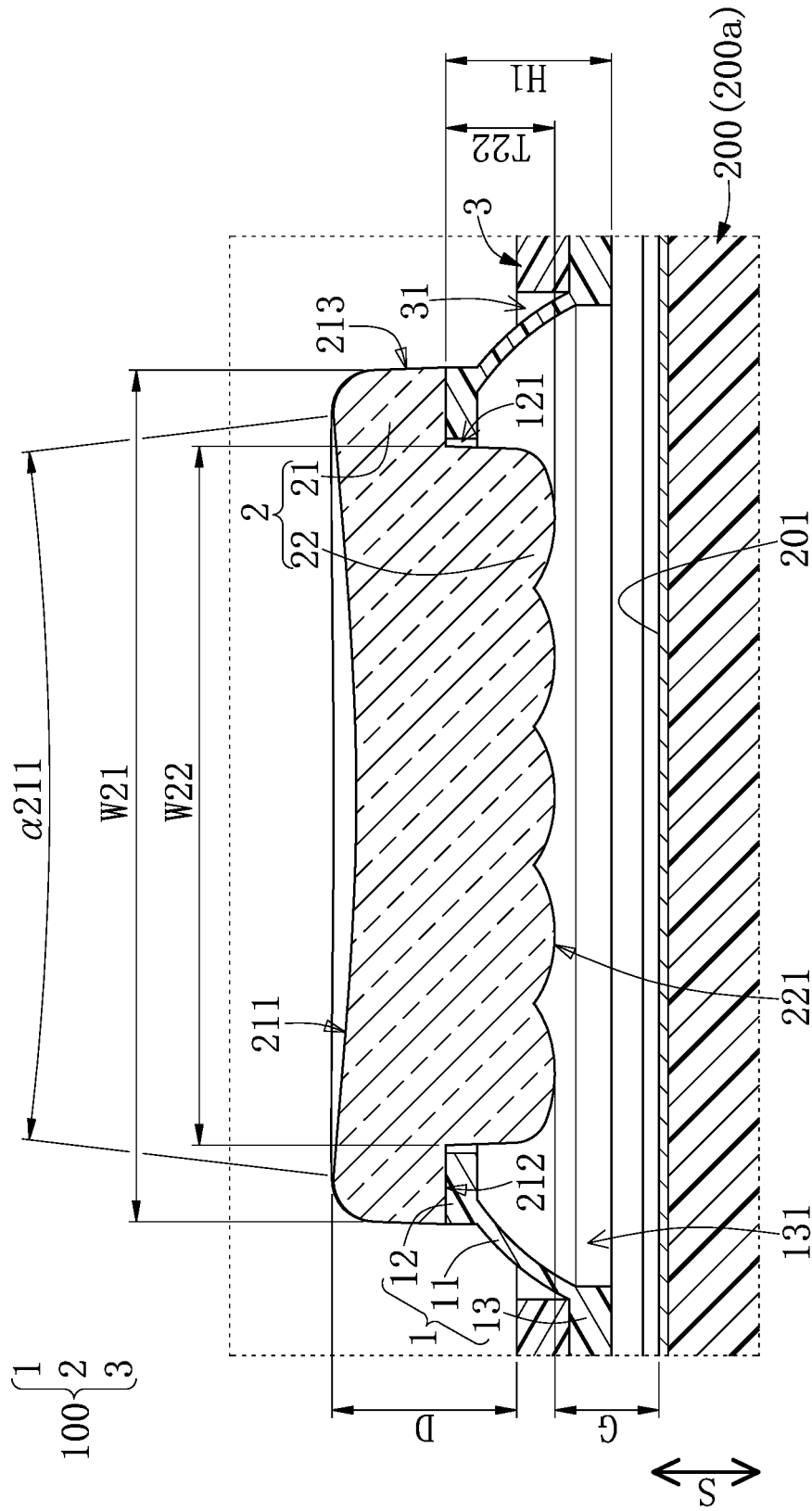
FIG. 8 is a cross-sectional view showing the transparent key in still another configuration according to the first embodiment of the present disclosure.

The abutting portion 22 is formed by being extended from the press portion 21 along a displacement direction S that extends away from the touch surface 211, and the abutting portion 22 in the present embodiment is substantially in a cubic shape and is connected to a region of the press portion 21 arranged inside of the annular step surface 212, but the present disclosure is not limited thereto. For example, as shown in FIG. 7 and FIG. 8, the abutting portion 22 can be at least one protrusion that is connected to the press portion 21.

Specifically, as shown in FIG. 2 and FIG. 4 to FIG. 6, a width W22 of the abutting portion 22 is less than a width W21 of the press portion 21, so that the press portion 21 and the abutting portion 22 can be jointly formed as a step-like structure. In other words, any abutting portion having a width equal to that of a press portion is different from the abutting portion 22 of the present embodiment. In addition, a thickness T22 of the abutting portion 22 in the present embodiment is preferably greater than that of the press portion 21, but the present disclosure is not limited thereto.

The press portion 21 of the transparent key 2 is fixed to the fixing segment 12 of the bracket 1, and the transparent key 2 does not contact a portion of the bracket 1 other than the fixing segment 12. The annular step surface 212 of the press portion 21 in the present embodiment is fixed to the fixing segment 12, the surrounding lateral surface 213 of the press portion 21 is flush with the outer edge of the fixing segment 12, and the touch surface 211 of the press portion 21 is arranged away from the bracket 1.

The abutting portion 22 does not protrude from the bracket 1 (i.e., the abutting portion 22 passes through the small opening 121 of the bracket 1, but does not pass through the big opening 131; or, the abutting portion 22 is arranged in a space surroundingly defined by the bracket 1), and the thickness T22 of the abutting portion 22 is 50%-90% of a height H1 (or a thickness H1) of the corresponding bracket 1, but the present disclosure is not limited thereto. For example, in other embodiments of the present disclosure, the abutting portion 22 can slightly protrude from the big opening 131 of the bracket 1.

Specifically, the touch surface 211 of the transparent key 2 is configured to move along the displacement direction S by being pressed, so that the elastic segment 11 of the corresponding bracket 1 is deformed to generate an elastic force. The abutting portion 22 can protrude from or pass through the big opening 131 of the bracket 1 by the movement of the transparent key 2. Moreover, when the touch surface 211 of the transparent key 2 is not pressed, the elastic segment 11 would release the elastic force to move the transparent key 2 to an initial position.

The cover 3 has a plurality of thru-holes 31, and each of the transparent keys 2 and the corresponding bracket 1 are arranged to pass through one of the thru-holes 31. Moreover, the placing segments 13 of the brackets 1 in the present embodiment are disposed on a portion of the touch-control screen 200 (e.g., a housing 203) other than the touch-control region 201, and the placing segments 13 of the brackets 1 are sandwiched between the cover 3 and the touch-control screen 200, but the present disclosure is not limited thereto.

For example, in other embodiments of the present disclosure, the placing segment 13 of each of the brackets 1 can be fixed to the cover 3, and the cover 3 is fixed to the touch-control screen 200; or, the placing segment 13 of each of the brackets 1 can be fixed to the housing 203 of the touch-control screen 200, but does not contact the cover 3 that is fixed to the touch-control screen 200.

Moreover, the abutting portion 22 of each of the transparent keys 2 faces toward and is spaced apart from the touch-control region 201. Specifically, a gap G between the abutting portion 22 and the touch-control region 201 is preferably equal to or less than a distance D from a top side of the transparent key 2 to the cover 3, so that when the transparent key 2 is pressed onto the touch-control region 201, the top side of the transparent key 2 can be exposed from the cover 3, but the present disclosure is not limited thereto.

In the present embodiment, a part of each of the transparent keys 2 facing the touch-control region 201 is configured to show an icon 202 of the touch-control region 201. Moreover, when any one of the icons 202 of the touch-control region 201 is contacted, the touch-control screen 200 can be operated in a corresponding function or can be operated to show a plurality of sub-icons (not shown) related to the icon 202.

Moreover, any one of the icons 202 of the touch-control region 201 can be observed from the touch surface 211 of the corresponding transparent key 2. In addition, in order to effectively expand a viewing angle of any one of the transparent keys 2 for observing the corresponding icon 202, the touch surface 211 in the present embodiment is a circular arc surface having a concave shape so as to provide the press portion 21 with the function of a concave lens.

Specifically, the transparent key 2 of the present embodiment can be provided with an optical function by the structural design of the touch surface 211. In other words, light emitted from the icon 202 and passing through the transparent key 2 would diverge through the touch surface 211, so that a user can observe the icon 202 in a larger viewing angle. Moreover, in order to provide the touch surface 211 of the transparent key 2 that is suitable to be pressed and that has the above optical function, any cross section of the touch surface 211 of the present embodiment parallel to the displacement direction S has a central angle $\alpha\,211$ that is preferably equal to or less than 15 degrees, but the present disclosure is not limited thereto.

Figure 5:
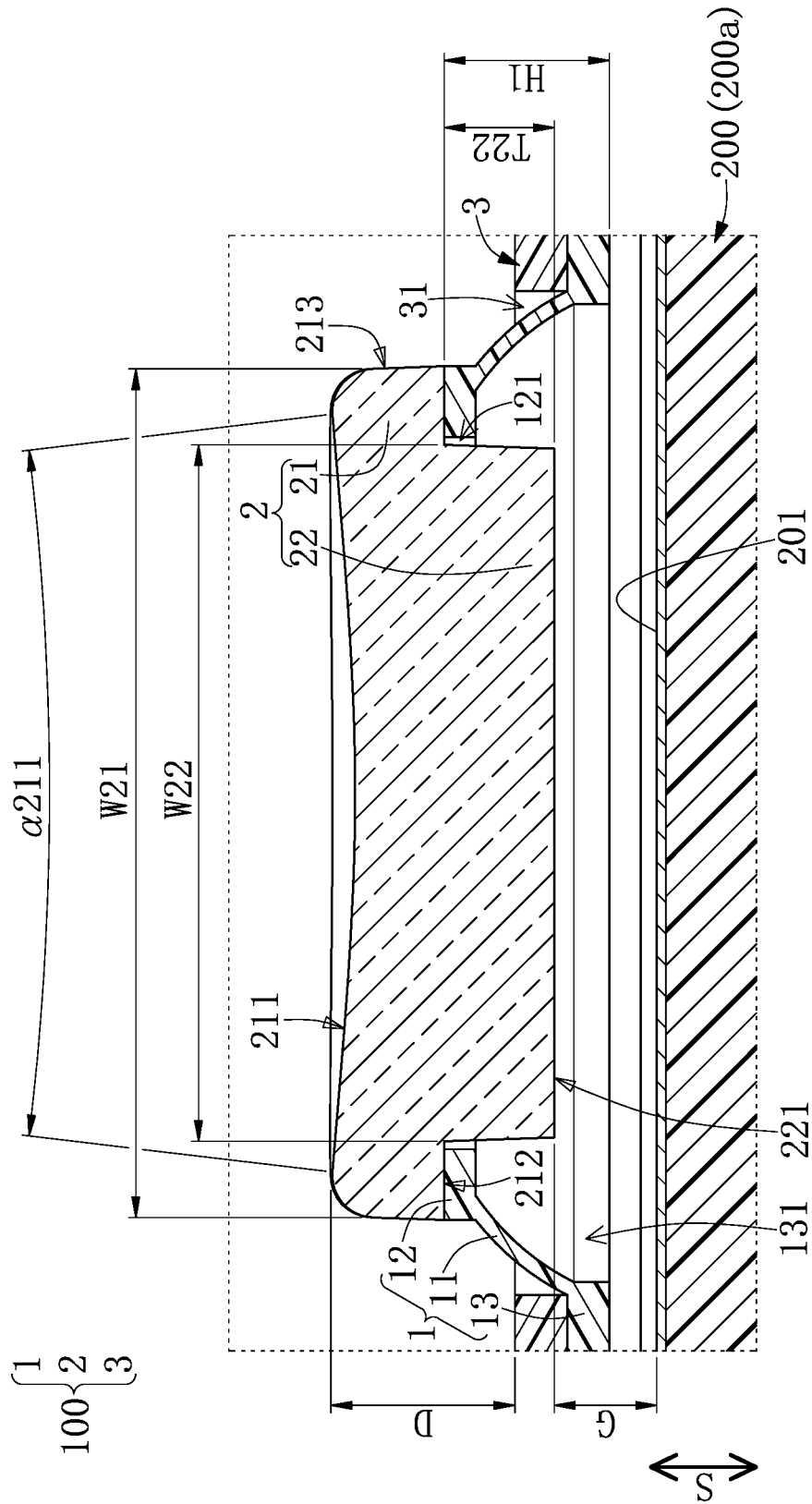
FIG. 5 is an enlarged view of portion V of FIG. 4.
Figure 6:
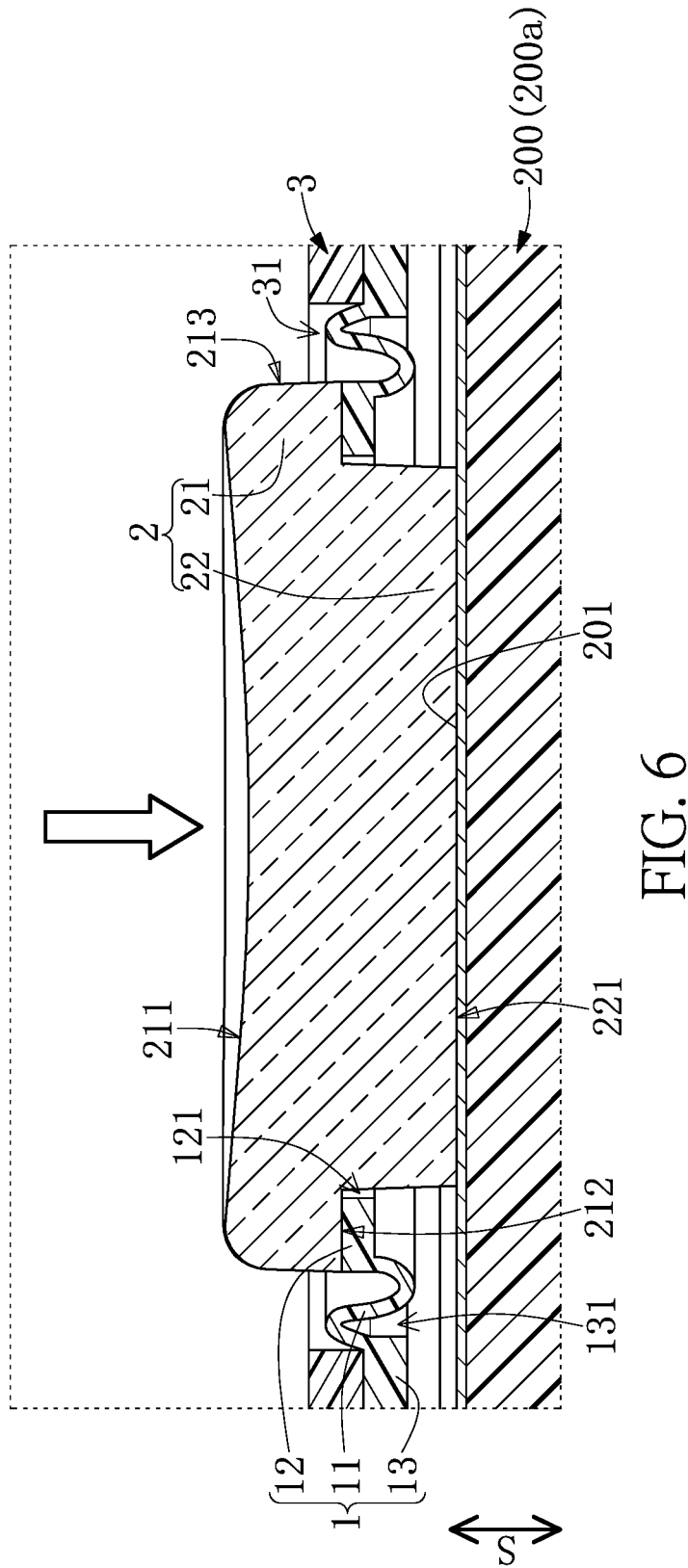
FIG. 6 is a cross-sectional view showing a transparent key of FIG. 5 being pressed.

As shown in FIG. 2, FIG. 5, and FIG. 6, the touch surface 211 of each of the transparent keys 2 is configured to be pressed so as to move the abutting portion 22 to abut against the corresponding icon 202. When the user presses the touch surface 211 of the transparent key 2, the elastic force generated from the elastic segment 11 of the bracket 1 and the abutting between the abutting portion 22 and the icon 202 can jointly provide a tactile feedback to the user, so that the user can control the button device with limited focus and can distinctly know when the transparent key 2 contacts the icon 202.

Specifically, in any one of the transparent keys 2, the abutting portion 22 has a triggering surface 221 facing the corresponding icon 202, and the triggering surface 221 is configured to abut against the icon 202 when the touch surface 211 is pressed. Moreover, the triggering surface 221 in the present embodiment is in a flat shape, so that the abutment between the triggering surface 221 and the icon 202 can easily trigger the capacitive touch-control screen 200a to be operated in a corresponding function or to show a plurality of sub-icons (not shown) related to the icon 202.

It should be noted that the touch-control screen 200 in the present embodiment is only triggered by the transparent key 2. In other words, any button device, which triggers a touch-control screen by other components (e.g., a bracket), is different from the button device of the present embodiment. Specifically, each of the brackets 1 in the present embodiment does not contact the touch-control region 201 of the touch-control screen 200, thereby preventing the brackets 1 from affecting the operation of the transparent keys 2. Accordingly, any bracket that may come in contact with a touch-control region is different from the bracket 1 of the present embodiment.

In a hypothetical case, the transparent key is provided without the abutting portion, and the bracket has at least one pillar-like soft contacting portion extending from a portion arranged inside of the elastic segment, so that the at least one pillar-like soft contacting portion can be used to contact the touch-control region. However, in the above hypothetical case, the touch-control screen can be triggered by the soft contacting portion, but the soft contacting portion cannot provide a tactile feedback such as that provided by the transparent key 2 of the present embodiment. Moreover, the soft contacting portion is only used to contact a peripheral portion of the icon, so that the icon may not be actually triggered by the soft contacting portion. Accordingly, the button device of the present embodiment excludes that of the above hypothetical case.

Second Embodiment

Figure 9:
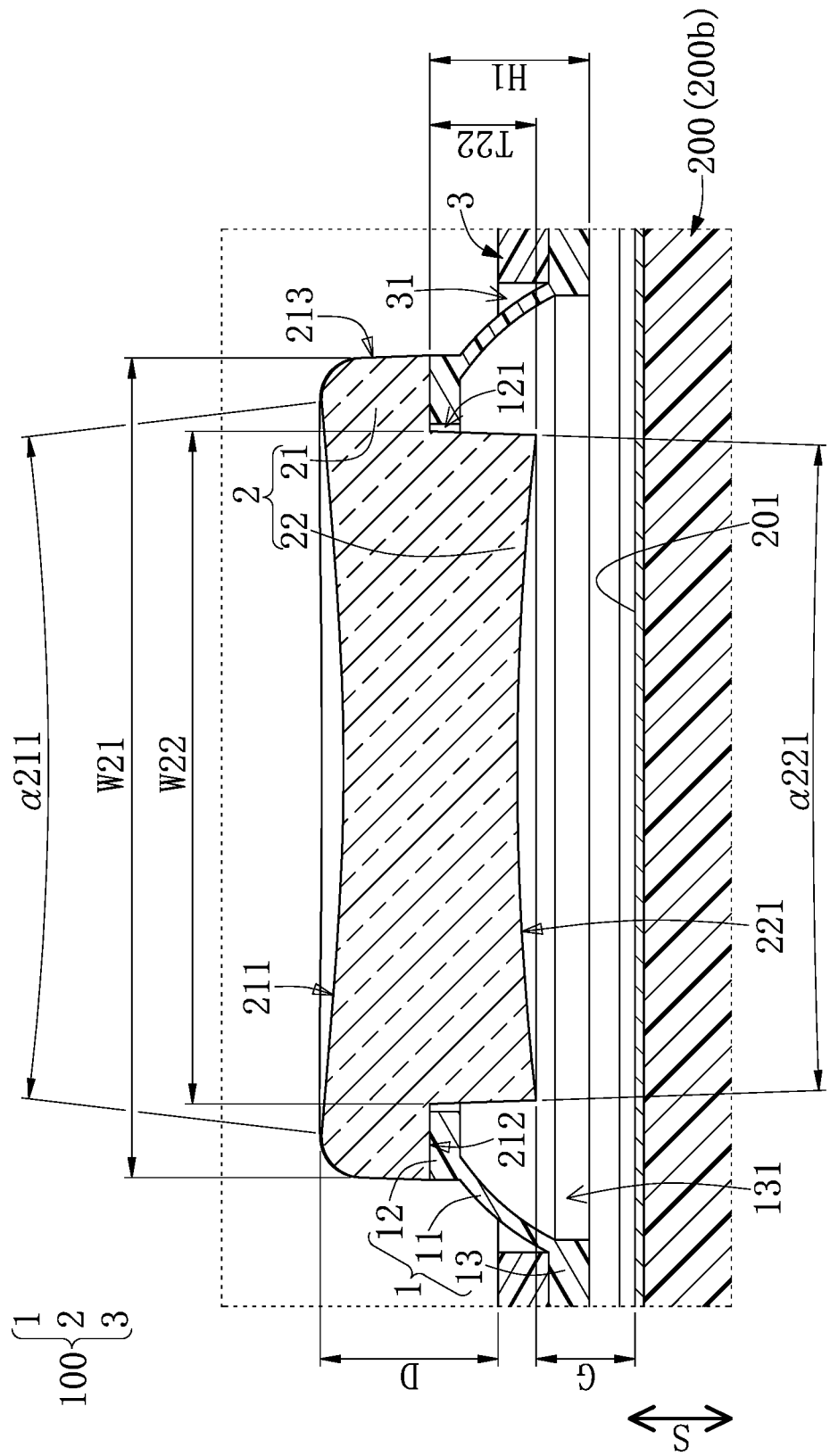
FIG. 9 is a cross-sectional view of a portion of a button device according to a second embodiment of the present disclosure.
Figure 10:
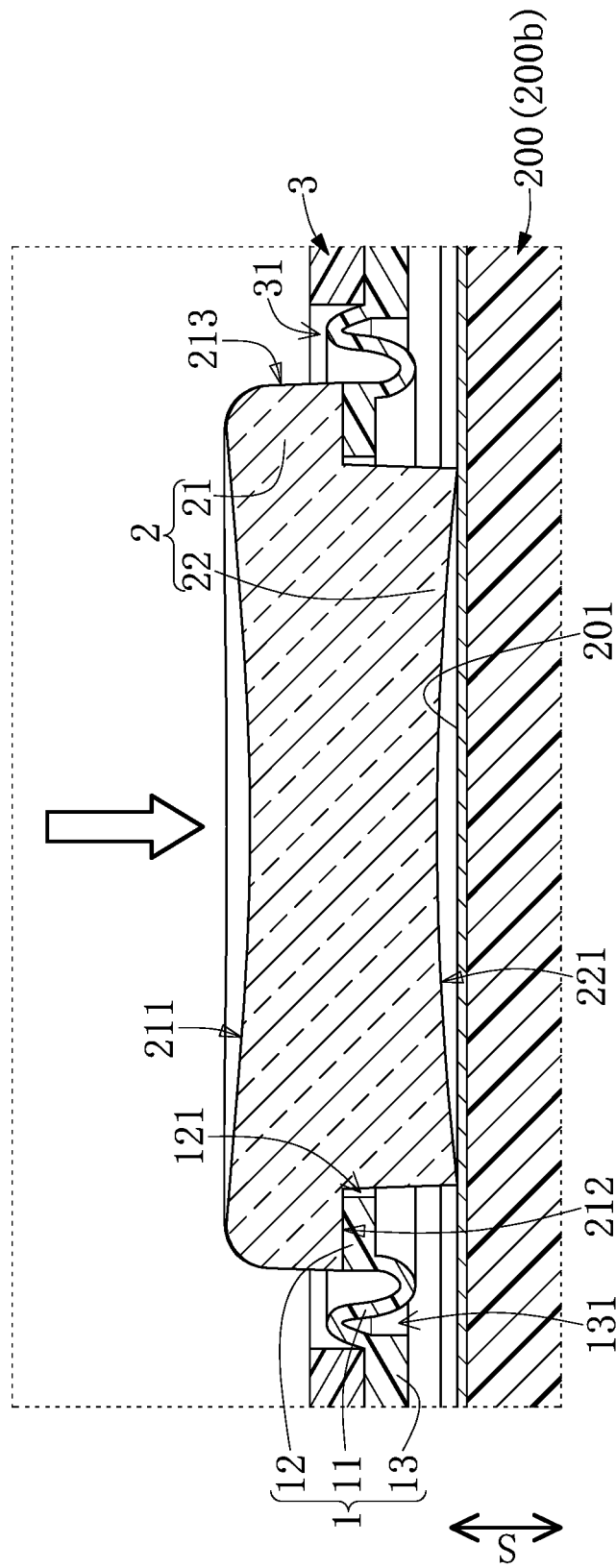
FIG. 10 is a cross-sectional view showing a transparent key of FIG. 9 being pressed.

Referring to FIG. 9 and FIG. 10, a second embodiment of the present disclosure is similar to the first embodiment of the present disclosure. For the sake of brevity, descriptions of the same components in the first and second embodiments of the present disclosure will be omitted, and the following description only discloses different features between the first and second embodiments.

In the present embodiment, the touch-control screen 200 is a resistive touch-control screen 200b. The operation of the touch-control screen 200 in the present embodiment is different from that of the capacitive touch-control screen 200a of the first embodiment, so that the structure of the transparent key 2 in the present embodiment is adjusted for the resistive touch-control screen 200b.

Specifically, in any one of the transparent keys 2, the triggering surface 221 of the abutting portion 22 is a circular arc surface having a concave shape so as to provide the abutting portion 22 with a concave lens function. In any cross section of the triggering surface 221 of the present embodiment parallel to the displacement direction S, a central angle $\alpha\,221$ of the triggering surface 221 is preferably equal to or less than 15 degrees, but the present disclosure is not limited thereto.

Since the touch-control screen 200 is of a resistive type, the triggering surface 221 of the abutting portion 22 does not need to be in a flat shape. Accordingly, the triggering surface 221 of the abutting portion 22 is adjusted to have a concave shape for effectively expanding a viewing angle of the transparent key 2 for observing the corresponding icon 202.

Third Embodiment

Figure 11:
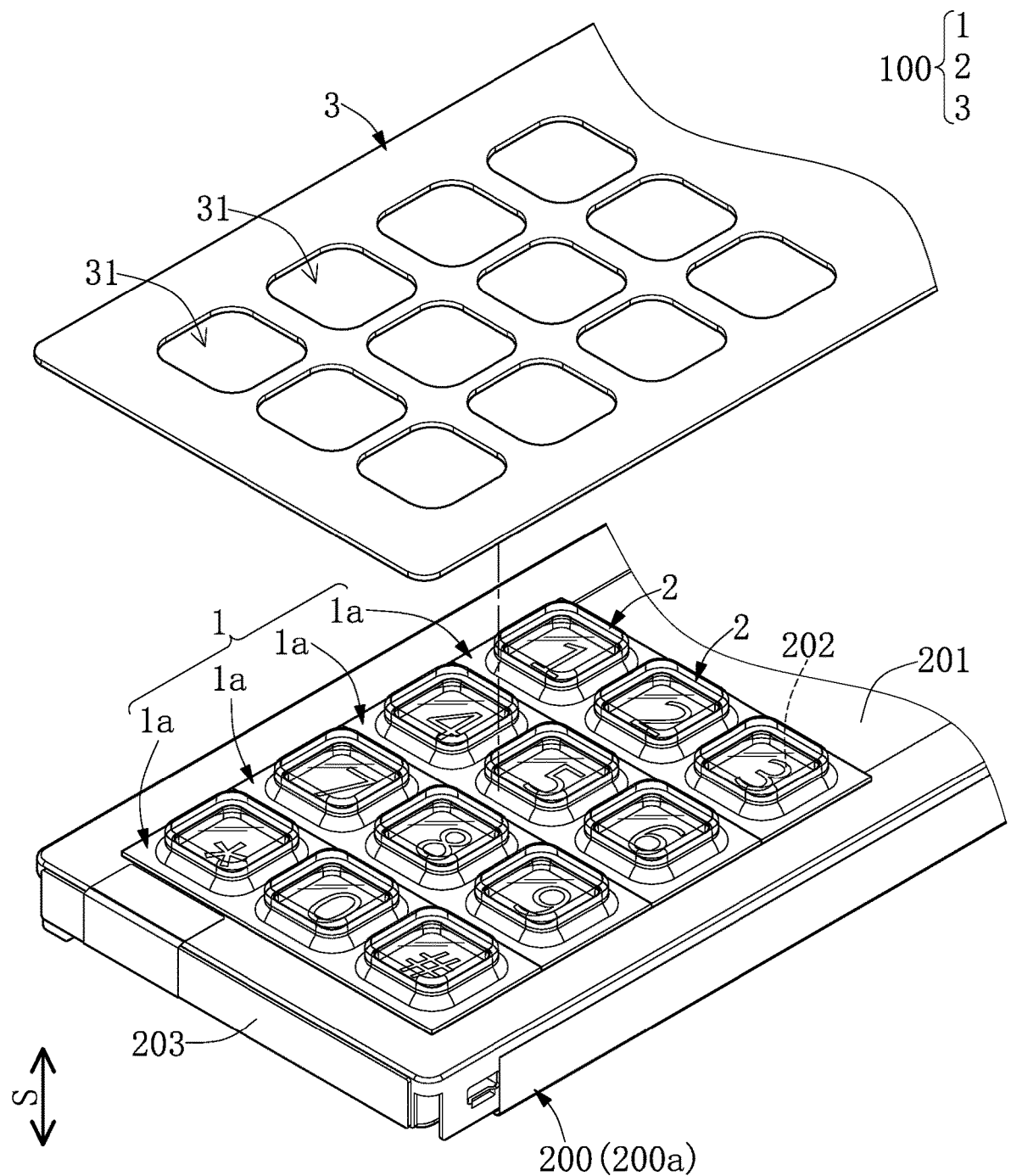
FIG. 11 is an exploded view of a button device according to a third embodiment of the present disclosure.
Figure 12:
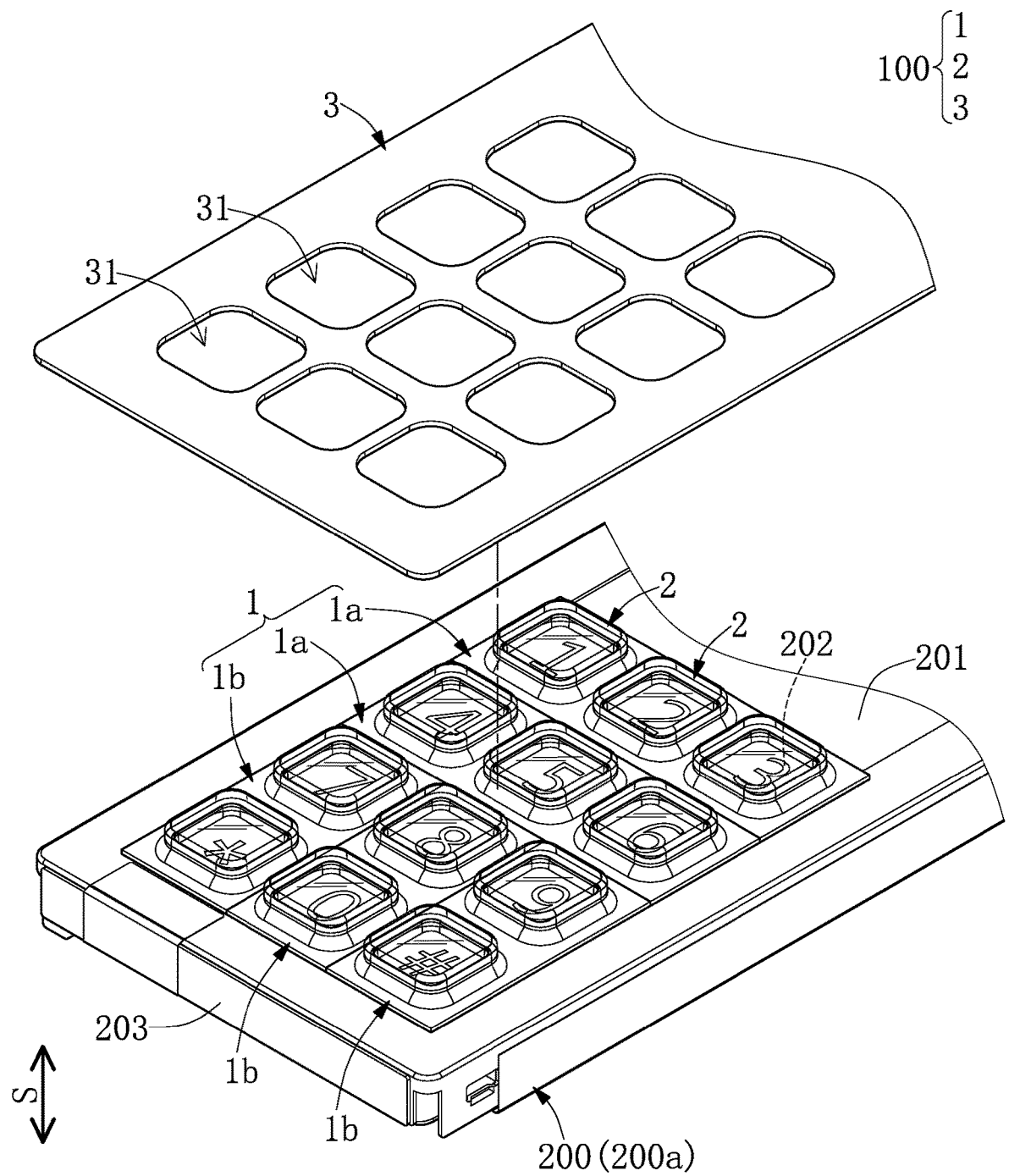
FIG. 12 is an exploded view showing the button device in another configuration according to the third embodiment of the present disclosure.

Referring to FIG. 11 and FIG. 12, a third embodiment of the present disclosure is similar to the above embodiments of the present disclosure. For the sake of brevity, descriptions of the same components in the present embodiment and the above embodiments of the present disclosure will be omitted, and the following description only discloses different features between the present embodiment and the above embodiments.

In the present embodiment, the brackets 1 are defined as a plurality of bracket assemblies 1a, 1b each having at least two of the brackets 1. The placing segments 13 of each of the bracket assemblies 1a, 1b are integrally formed as a one-piece structure. It should be noted that the number of the brackets 1 of any one of the bracket assemblies 1a, 1b can be adjusted according to design requirements, and the present disclosure is not limited thereto. For example, as shown in FIG. 11, the number of the brackets 1 of any one of the bracket assemblies 1a, 1b can be the same; or, as shown in FIG. 12, the number of the brackets 1 of any one of the bracket assemblies 1a, 1b can be different.

Accordingly, the manipulation structure 100 of the present embodiment is provided with the bracket assemblies 1a, 1b, so that the bracket assemblies 1a, 1b of the manipulation structure 100 can be distributed to form a desired pattern for satisfying different requirements according to the actual key arrangement of the touch-control region 201.

In conclusion, when a user presses the touch surface of the transparent key of the present disclosure, the elastic force generated from the elastic segment of the bracket and the abutment between the abutting portion and the icon can jointly provide a tactile feedback to the user, so that the user can control the button device with limited attention and can distinctly know when the transparent key contacts the icon.

Moreover, the transparent key in the present disclosure can be formed with an optical function by the structural design (e.g., a concave shape) of the touch surface (or the triggering surface), so that a viewing angle of the transparent key for observing the corresponding icon can be effectively expanded, and the user can control the button device (or the manipulation structure) with limited attention.

In addition, the manipulation structure of the present disclosure is provided with the bracket assemblies, so that the bracket assemblies of the manipulation structure can be distributed to form a desired pattern for satisfying different requirements according to the actual key arrangement of the touch-control region.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A button device, comprising:
   a manipulation structure including:
      a plurality of brackets each having an elastic segment, a fixing segment, and a placing segment, wherein the fixing segment and the placing segment of each of the brackets are connected to two opposite ends of the elastic segment, and the fixing segment of each of the brackets is in a rectangular ring-shape having an inner edge that defines an opening; and
      a plurality of transparent keys each having an inherently one-piece structure, wherein the transparent keys are respectively fixed to the brackets, and each of the transparent keys includes:
         a press portion having a central region and a peripheral region that surrounds the central region and that is fixed to the fixing segment of the corresponding bracket, wherein the press portion has a touch surface arranged away from the corresponding bracket; and
         an abutting portion extending from the central region of the press portion along a displacement direction that extends away from the touch surface, wherein a width of the abutting portion is less than that of the press portion, and the abutting portion passes through the opening of the fixing segment of the corresponding bracket,
      wherein the touch surface of each of the transparent keys is configured to move along the displacement direction by being pressed, so that the elastic segment of the corresponding bracket is deformed to generate an elastic force; and
   a touch-control screen having a touch-control region, wherein the manipulation structure is arranged corresponding in position to the touch-control region, and the abutting portion of each of the transparent keys faces toward and is spaced apart from the touch-control region,
   wherein a part of each of the transparent keys facing the touch-control region is configured to show an icon of the touch-control region, and
   wherein the touch surface of each of the transparent keys is configured to be pressed so as to move the abutting portion to abut against the corresponding icon, providing a tactile feedback.

2. The button device according to claim 1, wherein in each of the transparent keys and the corresponding bracket, the press portion has an annular step surface arranged away from the touch surface, the fixing segment is fixed onto the annular step surface, the abutting portion is connected to a region of the press portion arranged inside of the annular step surface, the abutting portion does not protrude from the corresponding bracket, and a thickness of the abutting portion is 50%-90% of a height of the corresponding bracket.

3. The button device according to claim 1, wherein the manipulation structure includes a cover having a plurality of thru-holes, each of the transparent keys and the corresponding bracket are arranged to pass through one of the thru-holes, and the placing segments of the brackets are sandwiched between the cover and the touch-control screen.

4. The button device according to claim 1, wherein the placing segments of the brackets are integrally formed as a one-piece structure, and each of the brackets does not contact the touch-control region of the touch-control screen.

5. The button device according to claim 1, wherein the brackets are defined as a plurality of bracket assemblies each having at least two of the brackets, and the placing segments of each of the bracket assemblies are integrally formed as a one-piece structure.

6. The button device according to claim 1, wherein in any one of the transparent keys, the touch surface is a circular arc surface having a concave shape so as to provide the press portion with a function of a concave lens.

7. The button device according to claim 6, wherein the touch-control screen is a capacitive touch-control screen, and wherein in any one of the transparent keys, the abutting portion has a triggering surface facing the corresponding icon, and the triggering surface is in a flat shape.

8. The button device according to claim 6, wherein the touch-control screen is a resistive touch-control screen, and wherein in any one of the transparent keys, the abutting portion has a triggering surface facing the corresponding icon, and the triggering surface is a circular arc surface having a concave shape so as to provide the abutting portion with the function of a concave lens.

* * * * *